United States Patent [19]
Yanagisawa et al.

[11] Patent Number: 5,839,363
[45] Date of Patent: Nov. 24, 1998

[54] METHOD AND APPARATUS FOR SEPARATING A SILK SCREEN FROM A PRINTED OBJECT

[75] Inventors: Yoshihiro Yanagisawa, Fujisawa; Tetsuya Kaneko, Yokohama, both of Japan

[73] Assignee: Canon Kabushiki Kaisha, Tokyo, Japan

[21] Appl. No.: 441,702

[22] Filed: May 15, 1995

[30] Foreign Application Priority Data

| May 16, 1994 | [JP] | Japan | ................................. | 6-101002 |
| May 18, 1994 | [JP] | Japan | ................................. | 6-103594 |
| May 10, 1995 | [JP] | Japan | ................................. | 7-111713 |

[51] Int. Cl.⁶ .................................................. B41F 15/44
[52] U.S. Cl. ........................................ 101/123; 101/129
[58] Field of Search .................................. 101/114, 123, 101/124, 127.1, 129

[56] References Cited

U.S. PATENT DOCUMENTS

| 3,731,623 | 5/1973 | Bubley et al. ............................ 101/123 |
| 4,254,707 | 3/1981 | Lambert et al. ......................... 101/123 |
| 4,275,655 | 6/1981 | Artaud et al. ............................ 101/129 |
| 4,537,126 | 8/1985 | Bubley ..................................... 101/123 |
| 4,854,229 | 8/1989 | Vassiliou ................................. 101/123 |
| 4,902,371 | 2/1990 | Andris et al. ............................ 101/129 |
| 5,036,760 | 8/1991 | Oozeki ..................................... 101/123 |
| 5,174,201 | 12/1992 | Andris et al. ............................ 101/129 |
| 5,273,780 | 12/1993 | Borger et al. ............................ 101/129 |

FOREIGN PATENT DOCUMENTS

| 0325401 | 7/1989 | European Pat. Off. . |
| 61-188146 | 8/1986 | Japan . |
| 139744 | 6/1988 | Japan ..................................... 101/129 |
| 4-347636 | 12/1992 | Japan . |
| 6-342636 | 12/1994 | Japan . |
| 1509285 | 9/1989 | U.S.S.R. ................................. 101/123 |
| 2013572 | 8/1979 | United Kingdom . |
| 2239427 | 7/1991 | United Kingdom . |

*Primary Examiner*—Stephen R. Funk
*Attorney, Agent, or Firm*—Fitzpatrick, Cella, Harper & Scinto

[57] ABSTRACT

A screen printer is provided with a printing table for setting an object to be printed, a screen, and a squeegee. The squeegee is arranged on the object to be printed, which is set on the printing table through the screen, and depending on the patterns set on the screen, ink patterns are formed on the object to be printed by allowing the squeegee to travel in a state that it is in contact with ink. This screen printer includes a mechanism for applying an external force which is movably arranged with respect to the screen, and is capable of applying an external force in the direction of offsetting the adhesive strength of ink between the screen and the object to be printed.

37 Claims, 11 Drawing Sheets

FIG. 1
FIG. 2
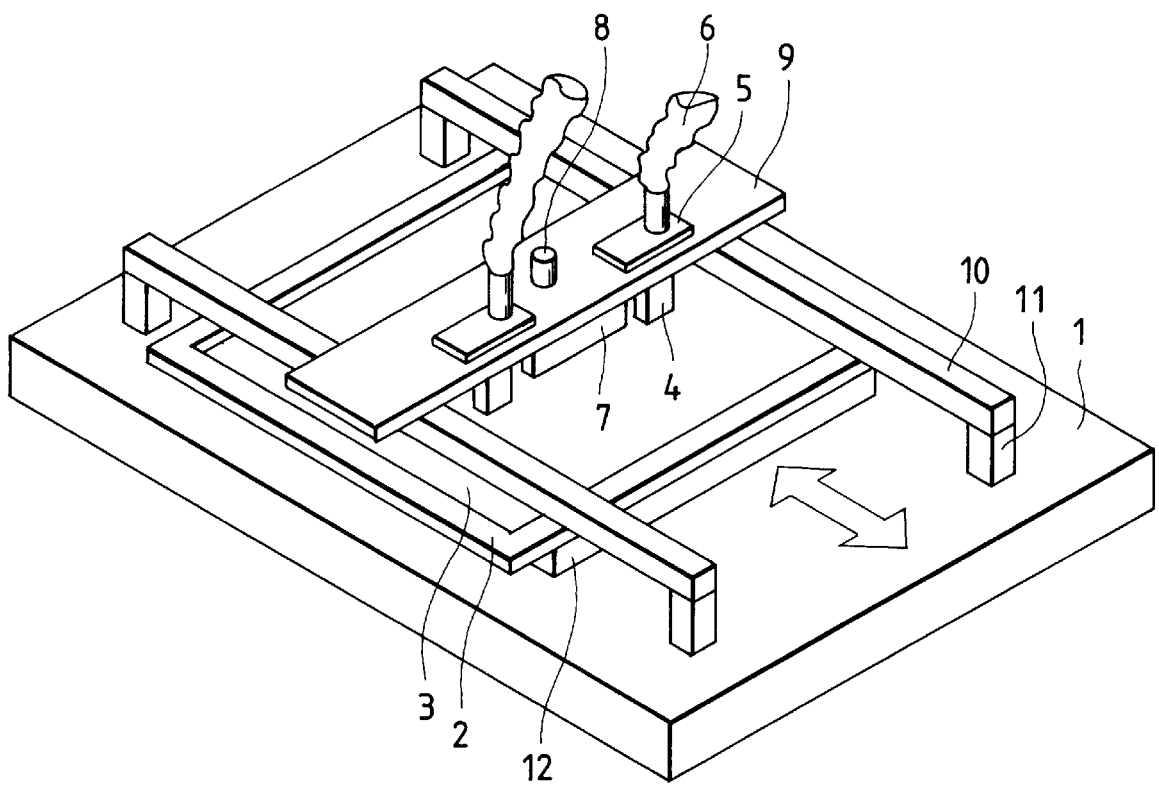
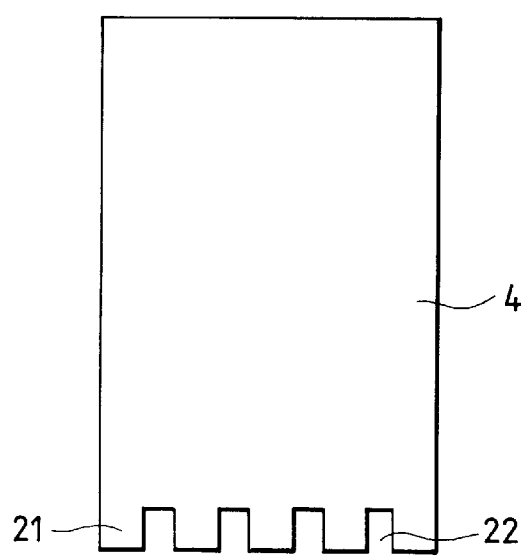

METHOD AND APPARATUS FOR SEPARATING A SILK SCREEN FROM A PRINTED OBJECT

BACKGROUND OF THE INVENTION

1. Field of the Invention

The present invention relates to a screen printer, a screen printing method, a method for manufacturing an image formation apparatus, and an image formation apparatus obtainable by use of such method for manufacturing the apparatus.

2. Related Background Art

The screen printing technologies and techniques are widely used at present in the fields of graphic printing, electronics, and the like.

In conjunction with FIGS. 14 and 15, the outline of screen printing will be described as follows:

In FIGS. 14 and 15, a reference numeral 2 designates a screen frame; 3, a screen; 7, a squeegee; 16, an object to be printed; 17, a pressed portion on the screen; 18, screen patterns; 19, ink patterns; 20 ink; 24; tension; and 23, gap. The screen 3 is formed by removing the screen patterns 18 in order to discharge ink 20 onto a resin film which is formed on the meshes made by stainless steel or other materials. The screen is tensioned on the screen frame 2 by the application of a given tensility.

The printing is executed in the procedures given below. After a given gap 23 is set between the screen frame 2 (that is the surface of the screen 3) and the object 16 to be printed, the paste-like ink 20 is placed on the screen 3. Then, while giving pressure to the squeegee 7 made of resin or the like, the ink is removed (that is, the squeegee is caused to travel in the direction indicated by an arrow in FIG. 14 and FIG. 15). At this juncture, depending on the pressure to be exerted, the ink 20 is discharged onto the object 16 to be printed through the patterns 18. Also, the screen 3 is caused to part from the object to be printed by the restoring force derived from the vertical component of the tension 24 at the pressed portion 17 of the screen. Thus ink 20 is left in desired ink patterns 19 formed on the object 16 to be printed.

However, the following problems are encountered in the conventional screen printing method.

FIG. 16 is a cross-sectional view schematically showing a screen portion which is in a state where a squeegee is being pressed for a screen printing. In FIG. 16, a reference numeral 3 designates a screen; 7, a squeegee; 16, an object to be printed; 17, a pressed portion on the screen; 24, tension; and 22, adhesive strength. In FIG. 16, the squeegee 7 is scanned from right to left.

The tension 24 of the screen 3 and the adhesive strength 22 of ink (not shown) between the screen 3 and the object 16 to be printed are applied to a portion 17 on the screen to be pressed immediately after the squeegee 7 is caused to scan. If this adhesive strength 22 is greater than the vertical component of the tension 21, the pressed portion 17 on the screen is unable to immediately part from the object 16 to be printed after the screen 3 has been scanned, and forced to remain as it is for a certain period. This defective screen separation brings about ink splashes around the patterns thus formed and leads to creating pattern peeling. When an electric circuit such as wiring is printed on a printed circuit board, such pattern peelings may cause wire breakage, short circuit, or other defects in some cases.

Also, as a kind of the screen printing method, a contact printing (non snap-off) is in practice. The contact printing (non snap-off) is such that the surface of screen is entirely in contact with an object to be printed. Printing patterns should be formed by scanning the squeegee across the screen in such a state (that is, with no gap between the screen and the object to be printed it (that is, with its gap=0), hence requiring the squeegee to travel for printing in such a state.

In the conventional contact printing (non snap-off) method, too, there is a problem of defective screen separation as in the case of the screen printing method generally adopted. FIG. 17 is a view which shows a state where the screen is separated after the squeegee has been allowed to travel in a contact printing. In FIG. 17, a reference numeral 3 designates a screen; 90, a portion where separation occurs; 16, an object to be printed; 24, tension; and 22, adhesive strength.

When the screen 3 and the object 16 to be printed are caused to part from each other in a contact printing, the forces exerted on the separating portion are those of the tension 24 provided by the screen 3 and the adhesive strength 22 given by ink (not shown). In the separating portion 90, the vertical component of the tension 24 becomes greater than the adhesive strength 22 at the time of making a specific angle between the screen 3 and the object 16 to be printed. In this way, it is possible to allow the screen separating portion 90 to part from the circumference of the object to be printed toward the central part thereof as the separation from the object 16 to be printed advances. Therefore, the screen separation takes place beginning at the circumference of the object to be printed, and the separation in the central part occurs last. Because of this uneven screen separation within the plane of the object to be printed, there are some cases where ink splashing is caused in the circumference of the patterns, resulting in wire breakage and short circuit caused by separation of the pattern, or other pattern defects.

Now, in Japanese Patent Laid-Open Application 4-347636, a screen printer is disclosed, wherein the screen is being separated from an object to be printed while exerting fine, high frequency vibrations on the screen when it is separated from the printed objected. In accordance with this Laid-Open application, it is assumed that paste can easily be removed from a print.

However, there is a tendency that vibrations are not propagated sufficiently to the screen due to the resin film even if vibrations are exerted on the frame in such a state as described above, because the circumference of the screen is usually fixed to the screen frame by the tension exerted by the flexible resin film. Particularly, the propagation of the vibration becomes insufficient in the region where the patterns are present. Therefore, it is still difficult to effectuate the required separation satisfactorily. In order to promote the separation, the intensity of vibration should be enhanced, but this enhancement results in the degradation of the precision in which the contour of patterns should be transferred. As a result, a problem is created anew that although the separation can be promoted, the desired contour of patterns cannot be obtained. As described above, the method whereby to give vibrations to the screen frame is not necessarily satisfactory in consideration of the fact that the desirable separation should be achieved, while maintaining the precision required for transferring the printing patterns in good condition at the same time. It is also conceivable that vibrations are given not only to the screen frame, but also given directly to the screen itself, but the same problem still remains unsolved with respect to the promotion of the separation and the maintenance of precise pattern transfer.

SUMMARY OF THE INVENTION

It is an object of the present invention to provide a screen printer and a screen printing method for which the technical problems described above are solved.

It is another object of the invention to provide a screen printer and a screen printing method capable of executing stable and uniform printing in the entire area of screen patterns as compared to the conventional printer and method.

It is still another object of the invention to provide a method for manufacturing an image forming apparatus using the screen printing method of the present invention, and an image formation apparatus obtainable by use of such method of manufacture.

In accordance with the present invention, a screen printer is of such a structure as given below. In other words, the screen printer of the present invention comprises a printing table to set an object to be printed on it, a screen, and a squeegee, and then, through the screen, the squeegee is arranged on the object to be printed placed on the printing table; thus, depending on the patterns provided for the screen, ink patterns are formed on the object to be printed by allowing the squeegee to move while the squeegee and ink are in contact with each other. This screen printer is further provided with means for applying external force movably arranged with respect to the screen and, also, capable of exerting the external force in the direction of offsetting the adhesive strength of ink between the screen and the object to be printed.

In accordance with the present invention, a screen printing method is to arrange a squeegee on an object to be printed through a screen, and form ink patterns on the object to be printed, depending on the patterns provided for the screen, while allowing the squeegee to travel in a state where it is in contact with ink. This method comprises the steps of forming the ink patterns by allowing the squeegee to travel, and of applying an external force to enable the screen to be separated from the object to be printed by means for applying external force arranged in a position which is shiftable with respect to the screen.

Therefore, it is possible to achieve the objects described above by the provision of a screen printer and screen printing method structured as above in accordance with the present invention.

BRIEF DESCRIPTION OF THE DRAWINGS

FIG. 1 is a view which schematically shows a screen printer having means for applying external force (separation means) by suction in accordance with the present invention.

FIG. 2 is a side view which shows the suction port connected to means for applying external force (separation means) by suction arranged for a screen printer provided with such suction means.

DETAILED DESCRIPTION OF THE PREFERRED EMBODIMENTS

Figure 3:
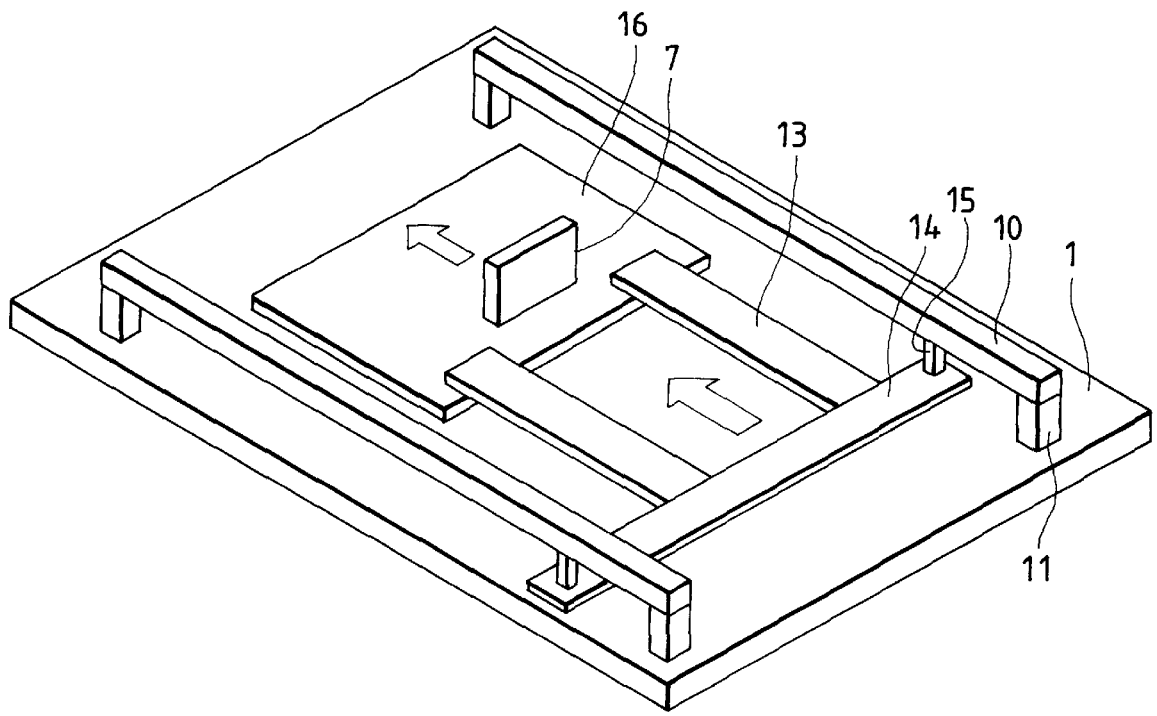
FIG. 3 is a view which schematically shows a screen printer having means for applying external force (separation means) formed by a rigid element in accordance with the present invention.

The screen printer and screen printing method of the present invention are structured as described above.

In a screen printer of the present invention, means for applying external force, which is movable with respect to the screen, includes those means of a type which is movable by being interlocked with the squeegee; of a type which is movable substantially in parallel with the plane of the screen; of a type which is movable in the direction substantially perpendicular to the plane of the screen; of a type which is rotative substantially around a shaft perpendicular to the plane of the screen; of a type which is rotative around a shaft substantially in parallel with the plane of the screen; and of a type which is rotative by use of hinges.

In a screen printing method of the present invention, the position shiftable with respect to the screen includes the position which is shiftable by being interlocked with the traveling squeegee; the position which is shiftable substantially in parallel with the plane of the screen; the position which is shiftable in the direction substantially perpendicular to the plane of the screen; the position which is rotative around the shaft substantially perpendicular to the plane of the screen; the position which is rotative around the shaft substantially in parallel with the plane of the screen; and the position which is rotative by use of hinges.

In accordance with the present invention, it is possible to offset the adhesive strength created between the screen and the object to be printed in an optimal state by use of means for applying external force which is movable with respect to the screen; thus obtaining an extremely fine separation and a good precision in which the printing patterns are transferred.

Hereinafter, with reference to the accompanying drawings, the present invention will be described.

FIG. 1 to FIG. 11 are views schematically showing one example of a screen printer in accordance with the present invention, respectively.

FIG. 1 and FIG. 2 illustrate a screen printer whose means for applying external force is executable by means for providing suction.

In FIGS. 1, and 2, a reference numeral 1 designates a printer frame; 2, a screen frame; and 3, a screen (or a mask). The screen frame 2 is fixed to the screen frame fixture (not shown) of the printer frame 1. A reference numeral 4 designates a suction port; 5, means for setting the position of the suction port; 6, an exhaust pipe which is connected to means for providing suction such as a vacuum pump (not shown); 7, a squeegee; 8, means for setting the squeegee height; 9, a head; and 10, a head rail. The head 9 can travel on the head rail 10 by means of a driving mechanism such as a motor (not shown). A reference numeral 11 designates a head rail fixture, and 12, a table to fix an object (not shown) to be printed. Also, the gap between the table 12 and the screen 3 is set by means for setting the table position which is not shown. Both the means for setting the suction port position and means for setting the squeegee position (not shown) are installed on the head 9, and the suction port 4 is interlocked with the squeegee to scan along with the scanning of the squeegee 7. With the arrangement of the suction port interlocked with the squeegee, the external force is being given to the screen stably so that the printing patterns are transferred in a good precision in the entire area of the screen patterns. Also, by means 5 for setting the suction port position, the angle and distance of the suction port 4 can be set arbitrarily with respect to the screen 3. Therefore, it is possible to achieve the desired separation without sucking the screen when the squeegee 7 scans if only an appropriate suction speed is set. Also, by arranging grooves 22 or the like on the leading end 21 of the suction port or a member (a gap adjustment member) with air passages, being capable of maintaining a specific gap on the leading end of the suction port, it is possible to provide the screen with such a specific external force constantly; hence obtaining a further enhancement of the desired precision in which the patterns can be transferred.

Figure 4:
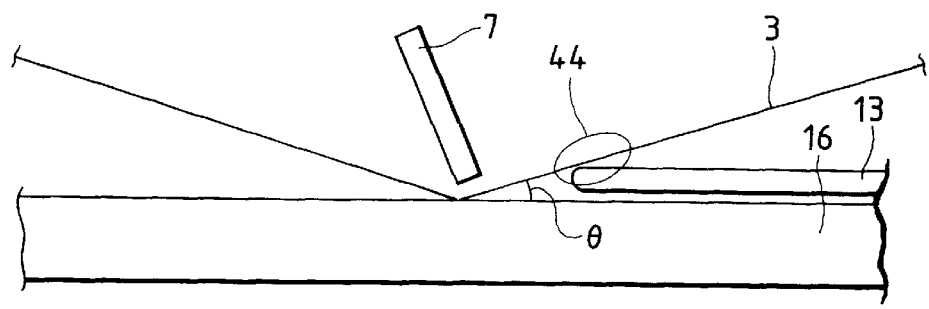
FIG. 4 is a cross-sectional view which shows the vicinity of the squeegee traveling portion of a screen printer having means for applying external force (separation means) by use of a rigid element.

FIG. 3 and FIG. 4 are respectively a perspective view showing a printer which uses a rigid element as means for applying external force and executes the screen separation by the application of its mechanical force (resistance), and a cross-sectional view showing the vicinity of the scanning portion of the squeegee. In FIGS. 3 and 4, a reference numeral 13 designates a member formed by a rigid element used for executing the separation; 14, a supporting member for use of separation; 15, a connecting member; and 16, an object to be printed. The member 13 for executing the separation is inserted between the object to be printed 16 and the screen 3. In this case, when the member 13 for executing the separation is used, the patterns should not be damaged under any circumstances after the squeegee has scanned. The surface of the screen should be separated uniformly. To this end, it is preferable to arrange the member 13 for executing the separation on two locations with the scanning area between them. A member 13 for executing the separation of the kind is integrally formed with the head together with the squeegee so that it is interlocked with the squeegee 7 by means of a connecting member 15. Or if not integrated, there should be provided means for driving the rigid element to scan so that the member for executing the separation can travel at the same speed as the scanning squeegee, thus making it possible to interlock the member with the scanning squeegee. Also, in order to avoid any damage to the screen, the leading end of the rigid element is provided with a curvature and covered with polymer such as Teflon® coating containing fluorine. It is desirable to arrange the member in a state substantially in parallel with an object to be printed.

Figure 5:
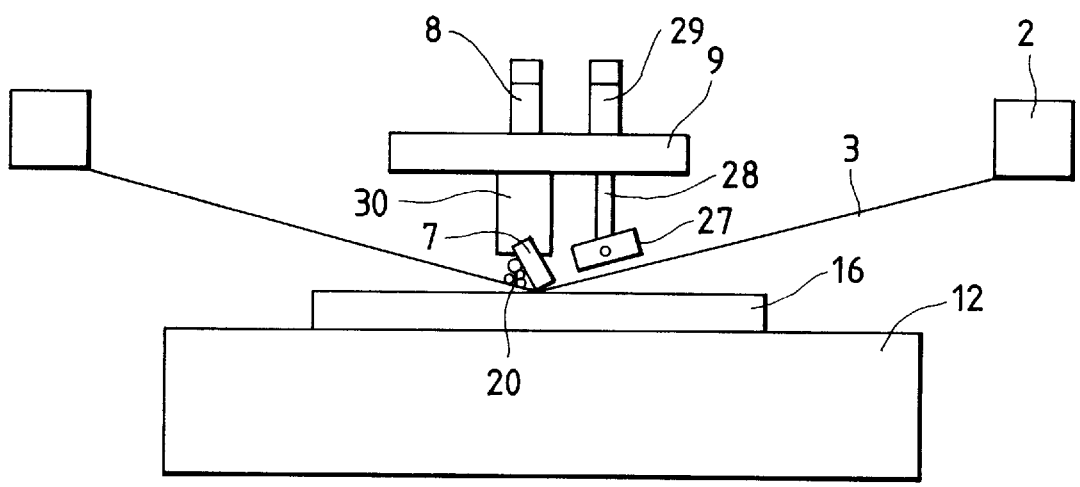
FIG. 5 is a cross-sectional view which shows a screen printer having means for applying external force (separation means) by use of a magnet arranged behind the squeegee.

FIG. 5 is a cross-sectional view which shows the principal part of a printer when a magnet is used for providing an external force.

In FIG. 5, a reference numeral 27 designates a magnet for attracting the screen; 28, a supporting member for the magnet 27; 29, means for setting the height of the magnet; 7, a squeegee; 30, a supporting member for the squeegee; 8, means for setting the height of the squeegee; 9, a head; 2, a screen frame; 3, a screen; 16, an object to be printed; 12, a table; and 20, ink. The member 28 for supporting the magnet is fixed to the head 9 together with the member 30 for supporting the squeegee. Therefore, the magnet for attracting the screen is allowed to scan together with the scanning squeegee 7. In this way, it is possible to enhance the precision in which the patterns are transferred because an external force is exerted on the screen constantly.

The magnet 27 for attracting the screen is fixed to the magnet supporting member 28 so that it can be installed at an arbitrary angle to the surface of the table 12. Further, the magnet 27 for attracting the screen can be set by the means 29 for setting the height of the magnet at an arbitrary height from the table 12. With the structure described above, the magnet 27 for attracting the screen can be set at an angle in a distance to the squeegee arbitrarily. Thus it is made possible to execute the separation without any touch or contact with the screen when the squeegee scans if only a magnet of an appropriate magnetic force is selected. In this case, if an electromagnet is used as the magnet, the printing operativity can be enhanced because its magnetic force can be selected arbitrarily or it can be made zero. Also, if the magnet 27 for attracting the screen is made greater than the width of the squeegee (the length in the direction perpendicular to the plane of FIG. 5), it is possible to attract by the magnetic force all the area scanned by the squeegee. The press-in amount of the squeegee 7 can be set arbitrarily through the squeegee supporting member 30 by use of the means 8 for setting the height of the squeegee. In this respect, the patterns are formed when the squeegee scans from right to left in FIG. 5.

As described above, the state of separation can be improved by the provision of the external force. Also, it is possible to enhance it more by selecting the meshes formed by stainless steel for use of the screen. If the mesh size is small, while its wire diameter is large, ink cannot pass the screen to be used in a good condition. As a result, when wiring is formed, its breakage takes place among other defects. There is encountered a problem, particularly when a highly precise fine wiring is formed in matrix for a flat type display having an area of as large as 40 inches or more. It is preferable to adopt 300 meshes or more, and 20 $\mu$m or less for wire diameter, respectively, for the mesh size and the diameter of wires to be used for a screen adopted for this purpose. Particularly, for the formation of a highly precise pattern, it is preferable to adopt a stainless screen of 350 meshes or more having its wire diameter of 16 $\mu$m or less.

Now, in conjunction with FIG. 6 and FIG. 7, the description will be made of a printing method in accordance with the present invention.

Figure 6A:
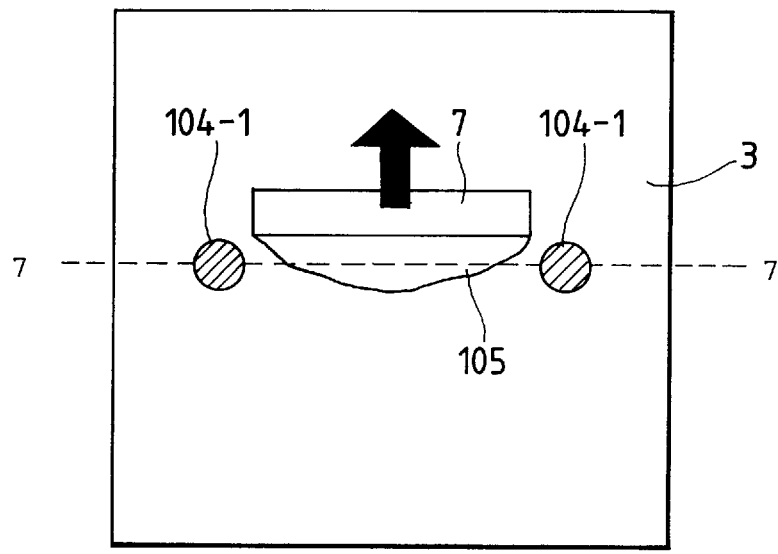
FIGS. 6A and 6B are plan views which schematically show a position for providing external force in a printing method which uses a printer of the present invention.
Figure 6B:
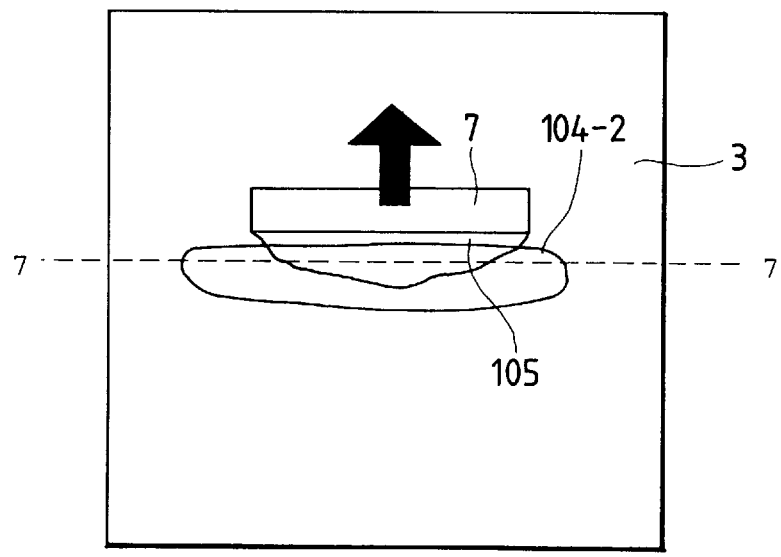

Both FIG. 6A and 6B are plan views which represent the vicinity of a squeegee when it scans. FIG. 6A illustrates a case where the external force is a suction or mechanical force that may affect the printing patterns. FIG. 6B illustrates a case where the external force is a magnetic force or the like whose influence exerted on ink is extremely small or none. In this respect, FIG. 7 is a cross-sectional view taken along line 7—7 in FIG. 6A.

Figure 7:
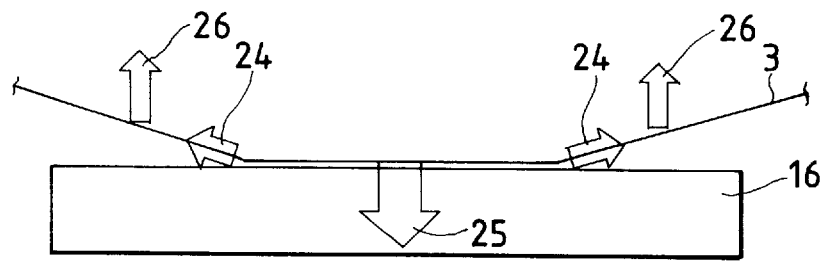
FIG. 7 is a sectional view of FIG. 6A along a line of 7—7.

In FIGS. 6A, 6B and 7, the squeegee scans in the direction indicated by arrows. Here, a reference numeral 3 designates a screen; 7, a squeegee; 16, an object to be printed; 24, tension; 25, adhesive strength; 104-1, and 104-2, portions where the external force is applied, the external force being exerted in the direction of offsetting the adhesive strength between the screen and the object to be printed when the squeegee scans; 105, the portion which illustrates schematically a defective screen separation, which is brought about by the conventional defective screen separation; and 26, an external force. The defective portion 105 of the conventional screen separation takes place on a printed portion on the screen immediately after a squeegee has scanned. This is due to the fact that the adhesive strength 25 of ink exerted on the screen is greater than the vertical component of tension given to the screen with respect to the plane of the screen. The portions 104-1 and 104-2 where the external force is applied are behind the traveling squeegee, and also, close to the squeegee, but if the applied external force is a mechanical force such as created by suction or by a rigid element, the portion 104-1 should not be allowed under any circumstances to include any area where the squeegee scans or the screen patterns are formed. In contrast, when the external force is a magnetic force or the like, the portion 104-2 should preferably cover the area where the squeegee scans. The difference between the cases represented in FIG. 6A and FIG. 6B is that in FIG. 6A, the external force is suction or the like, and it is impossible to transfer the patterns in a good condition if the external force is exerted in the area of the screen for the printing pattern formation, because ink is sucked or scraped off when the squeegee scans such area for printing, while, in FIG. 6B, the external force is a magnetic force or the like which rarely affects the transfer of ink, thus making it possible to provide a large area for the sufficient application of the external force in a desirable condition.

The portion where the external force is applied can shift on the screen along with the scanning squeegee. Therefore, an arrangement is made to shift it by being interlocked with the scanning squeegee, while maintaining a constant distance between the squeegee and the portion of the external force being applied. In this way, to the portion 104-1 or 104-2, where the external force is applied, it is possible to apply the external force 26 working in the direction of offsetting the adhesive strength 25. Thus the vertical component of the tension given to the screen can be uniformly compensated with respect to the plane of the screen so as to make the screen separation better, and the pattern formation more stable and uniform at the same time.

For the screen printing method of the present invention, it is possible to adopt any means as means for applying the external force which can promote the screen separation if only such means does not exert any influences that may damage ink patterns or the screen. Also, it may be possible to arrange means for applying external force either on the plane of the screen on the side of an object to be printed or on the side of the squeegee.

Now, in conjunction with the accompanying drawings, the description will be made of a contact printing method in accordance with the present invention.

FIG. 8 to FIG. 11 are views which represent contact screen printers of the present invention, respectively.

Figure 8:
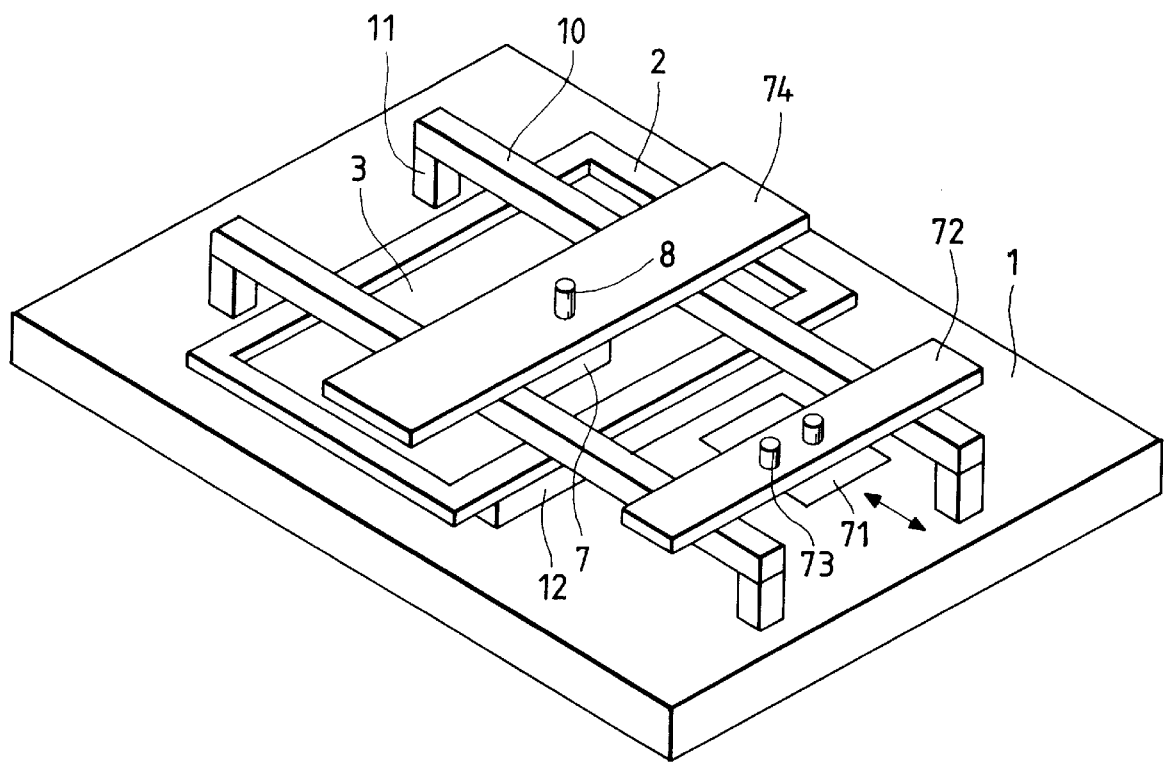
FIG. 8 is a view which schematically shows a screen printer capable of executing contact screen printing, which is provided with rails movable in parallel within the plane of the screen as movable magnetic means.

In FIG. 8, a reference numeral 1 designates a printer frame; 2, a screen frame; and 3, a screen formed by magnetic material.

The screen frame 2 is fixed to the screen frame fixture (not shown) of the printer frame 1. A reference numeral 7 designates a squeegee; 74, a supporting head for the squeegee; 8, means for setting the height of the squeegee; 71, a magnetic plate which adsorbs the screen, the size of which is larger than the area where the squeegee scans. As a magnetic plate usable for a printer which can be employed as the printer of the present invention, it should be good enough if only the magnetic plate provides a magnetic force whereby to adsorb the screen surface when it is separated from an object to be printed, while having a size large enough to cover the area where the squeegee scans. A permanent magnet or an electromagnet can be used, but as described earlier, it is preferable to adopt an electromagnet in consideration of the adjustment that may be required for its magnetic force and other factors. In this respect, a reference numeral 72 designates the magnet supporting head, and 73, means for attracting the screen. With this means 73 for attracting the screen, the heights and angles of the magnetic plate 71 relative to the screen 3 are set. Now, a reference numeral 10 designates a head rail which serves as means for moving the magnet to a given position over the screen; 11, a fixture for the head rail which makes it possible for the squeegee supporting head 74 and the magnet supporting head 72 to travel on the head rail 10. Therefore, in FIG. 8, the squeegee 7, squeegee supporting head 74, means 8 for setting the squeegee height, head rail 10 and means 11 for fixing the head rail constitute squeegee scanning means. It is good enough if means for moving the magnetic plate and means for attracting the screen used for the screen printer of the present invention are installed with ordinary mechanical precision. For example, means for setting the position of squeegee scraper for an ordinary screen printer is sufficiently applicable as the screen attracting means in this respect. With a structure of the kind which is illustrated in FIG. 8, the magnet supporting head 72 and the squeegee supporting head 74 are able to scan on the head rail 10 in the directions indicated by arrows. Consequently, after the squeegee 7 has scanned on the screen 3 by allowing the squeegee supporting head 74 to scan, the magnet supporting head 72 scans to enable the magnetic plate 71 to descend to the height at which to attract the screen 3. With such structure, it is possible to locate the magnetic plate 71 over the area of the screen 3 where the squeegee 7 scans. In this respect, a reference numeral 12 designates a table (printing stand) which holds an object to be printed (not shown). At this juncture, by means for setting the table position (not shown), it is possible to set the gap between the table 12 and screen 3. With the structure thus arranged, the screen 3 which is attracted to the magnetic plate can be separated from an object to be printed, hence making good screen separation possible.

Figure 11:
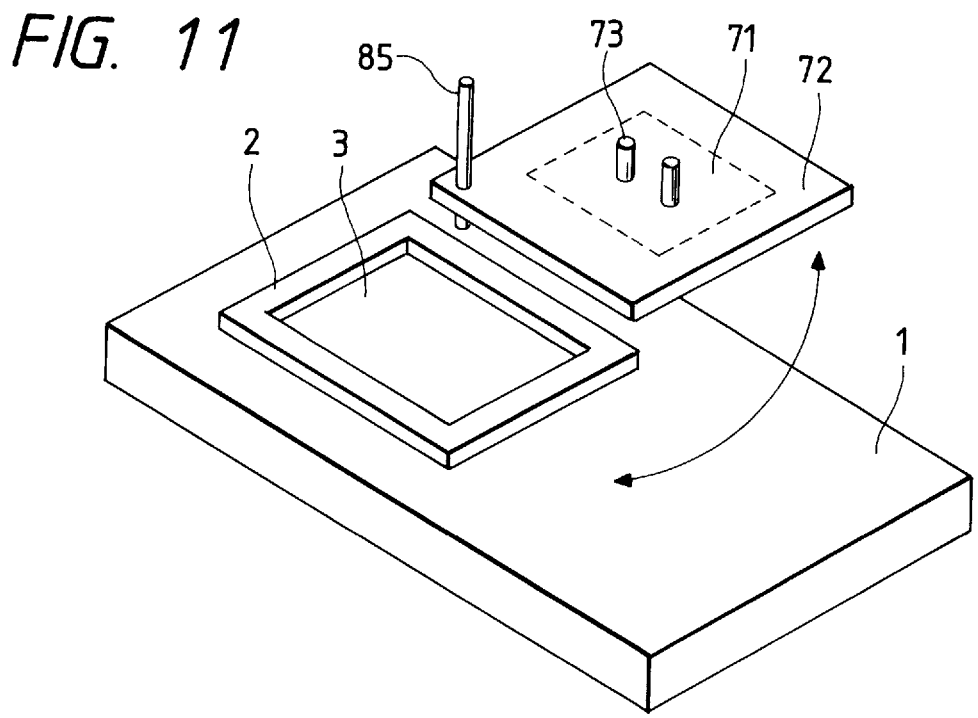
FIG. 11 is a view which schematically shows a screen printer capable of executing contact screen printing, which is provided with means for rotating a magnetic plate around the vertical shaft within the plane of the screen as movable magnetic means.

In this respect, while the description has been made of means for moving the magnetic plate used for the screen printer of the present invention, which is allowed to move in the same direction as the traveling direction of the squeegee shown in FIG. 8, the invention is not limited thereto, and it may be possible to adopt a magnetic plate which is movable in parallel to the plane of the screen or a magnetic plate which is rotative around the shaft 85 perpendicular to the screen surface which serves as means for moving the magnetic plate as shown in FIG. 11, for example.

Figure 9:
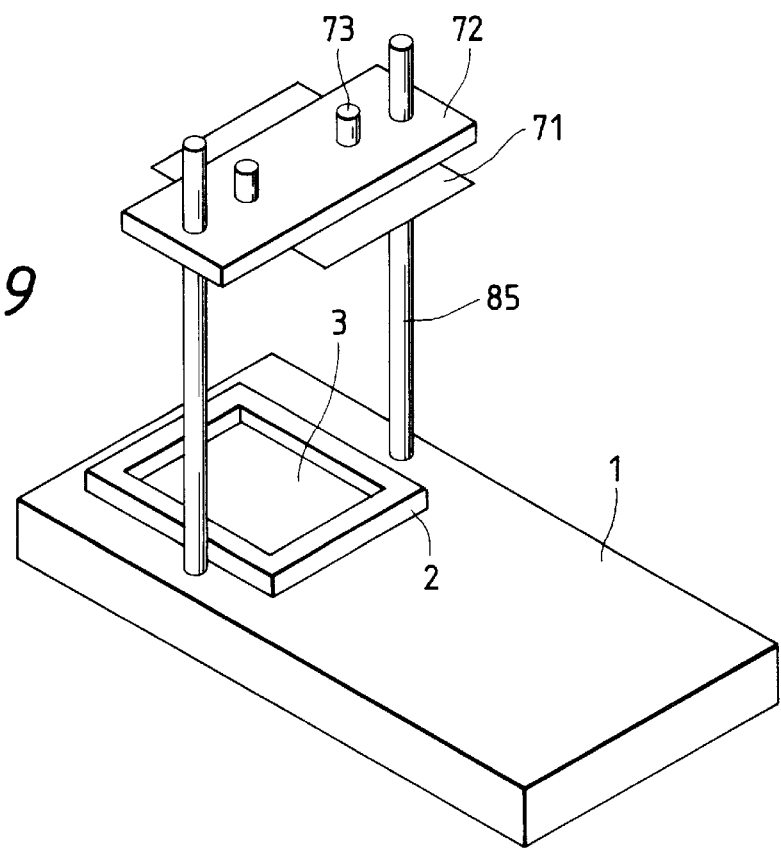
FIG. 9 is a view which schematically shows a screen printer capable of executing contact screen printing, which is provided with a shaft vertically movable within the plane of the screen as movable magnetic means.
Figure 10:
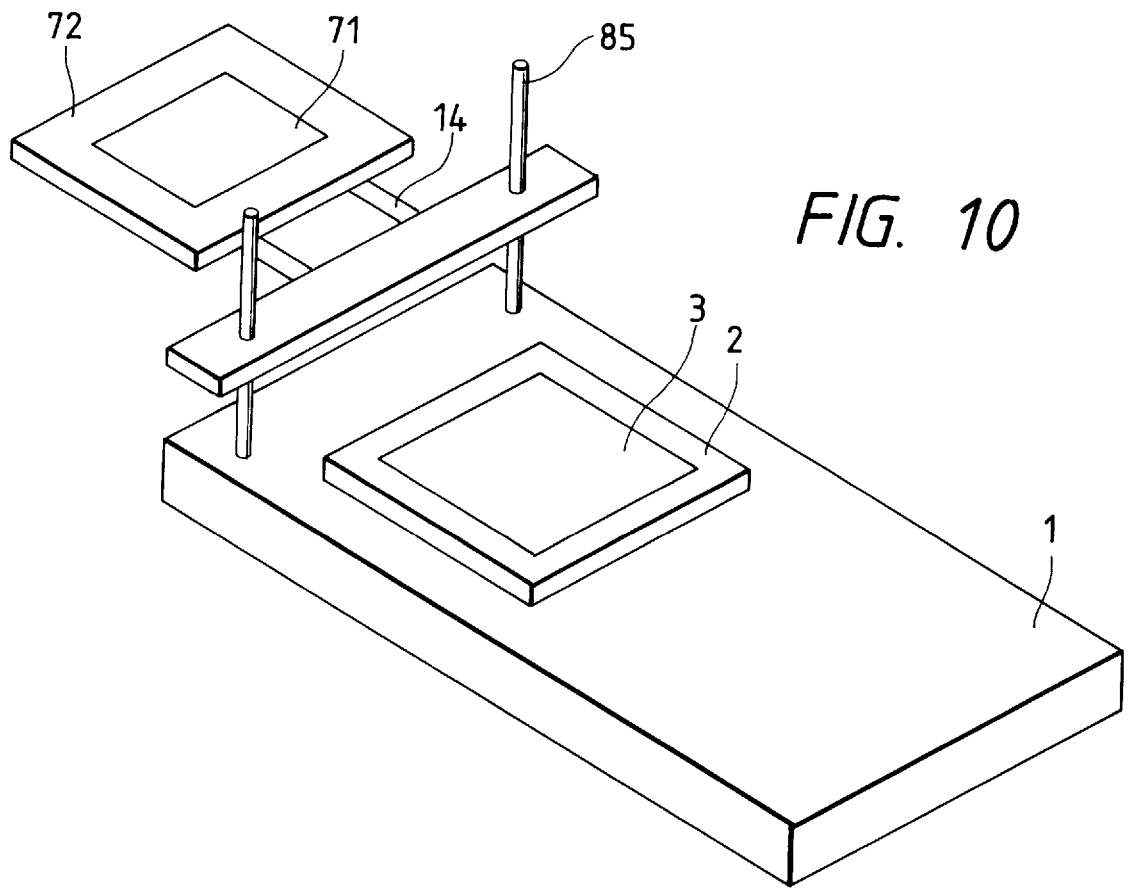
FIG. 10 is a view which schematically shows a screen printer having a means for applying an external rotational force using hinges.

Further, the present invention is not limited to the magnetic plate movable in parallel to the plane of the screen as described above, but, for example, a supporting member 85 for the magnetic plate supporting head is made means for supporting the magnetic plate as shown in FIG. 9, and then, a mode is arranged so that the magnetic plate moves in the direction perpendicular to the plane of the screen through such a supporting member or it may be possible to adopt a mode wherein the magnetic plate rotates around the shaft parallel to the plane of the screen, while arranging a hinge type supporting member 14 for magnetic plate supporting head as means for moving the magnetic plate as shown in FIG. 10.

Now, the description will be made of a printing method using a contact screen printer of the present invention.

While a screen is closely in contact with an object to be printed, ink is applied onto the screen. Then a squeegee scans on the screen by squeegee scanning means for the formation of printing patterns of the object to be printed. After that, the magnetic plate is caused to move above the screen by means for moving the magnetic plate. Then, subsequent to the screen thus attracted to the magnetic plate the object to be printed and the screen attracted to the magnetic plate are separated. In this way, after the squeegee has scanned, the screen is separated from the object to be printed subsequent to allowing the screen to be attracted to the magnetic plate, hence making it possible to perform the screen separation uniformly at least in the area including the patterns to be printed, and prevent the uneven screen separation which has been a problem in the conventional screen printing. In this way, ink splashing around the formed patterns and the pattern peeling can be avoided. Particularly, when wiring is printed on a base board (or substrate) for the formation of a circuit board, it is possible to avoid patterning defects that may result in wire breakage, short circuit, or other defects.

Now, as a method for manufacturing a circuit board by use of a printer of the present invention, the description will be made of methods for manufacturing an electronic source board using a surface conduction type electron emitting element, and for manufacturing an image formation apparatus.

Figure 12A:
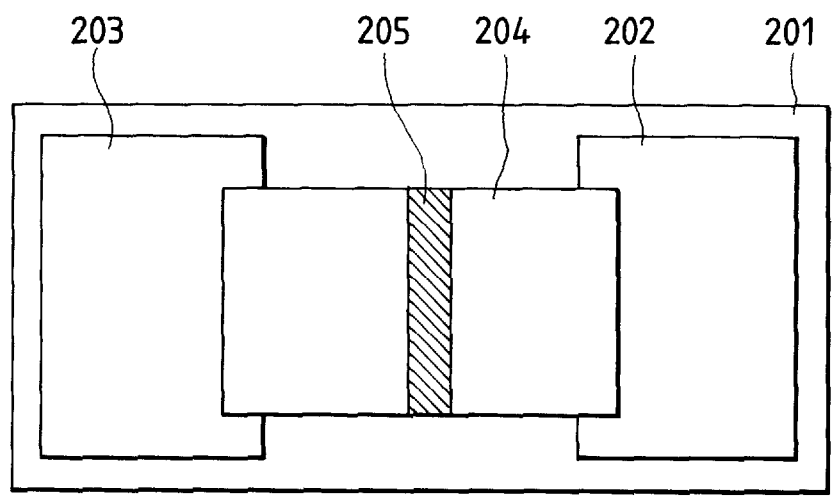
FIGS. 12A and 12B are a plan view and a cross-sectional view showing a surface conduction type electron emitting element which uses electron source.
Figure 12B:
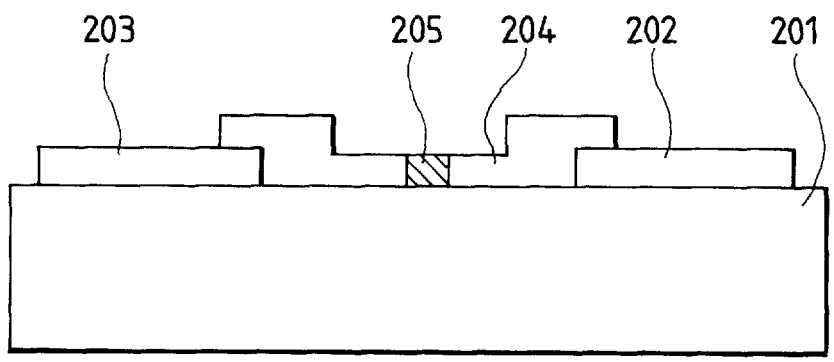
Figure 13A:
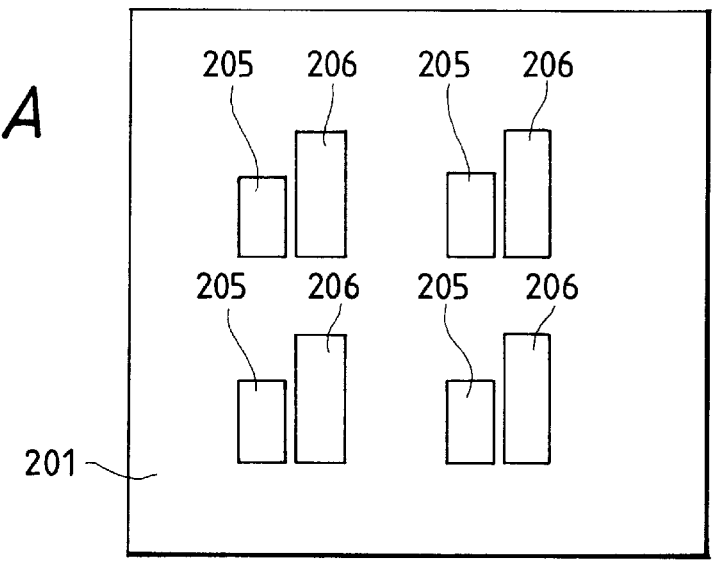
FIGS. 13A to 13E are plan views which shows the surface conduction type electron emitting element using an electron source, and its wiring formed in matrix, and a view which schematically shows the steps of manufacturing an electron source.
Figure 13B:
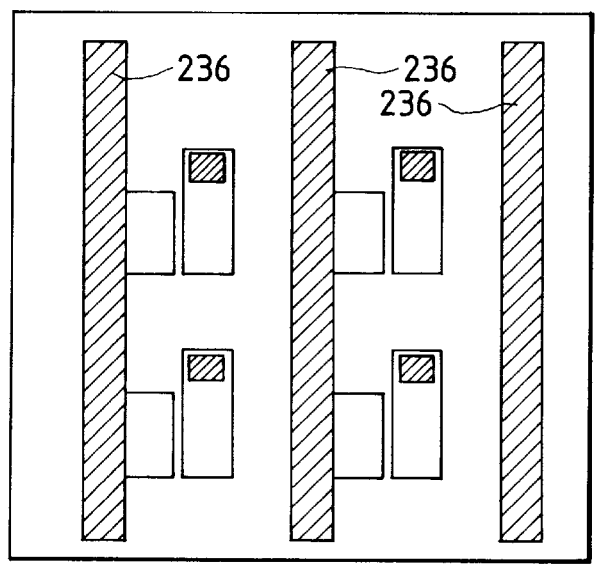
Figure 13C:
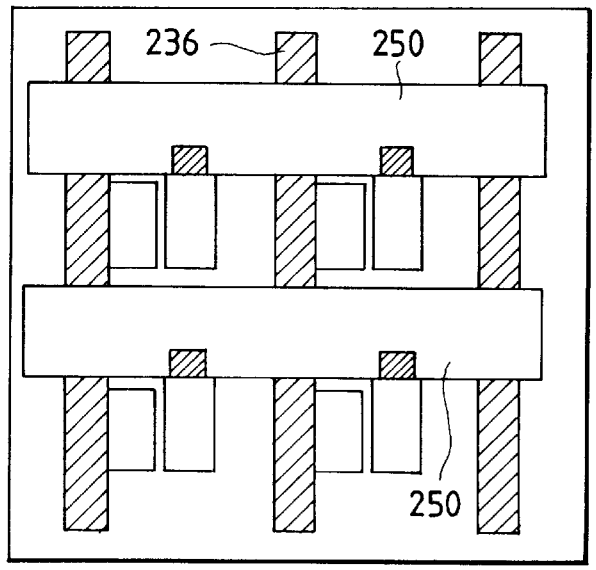
Figure 13D:
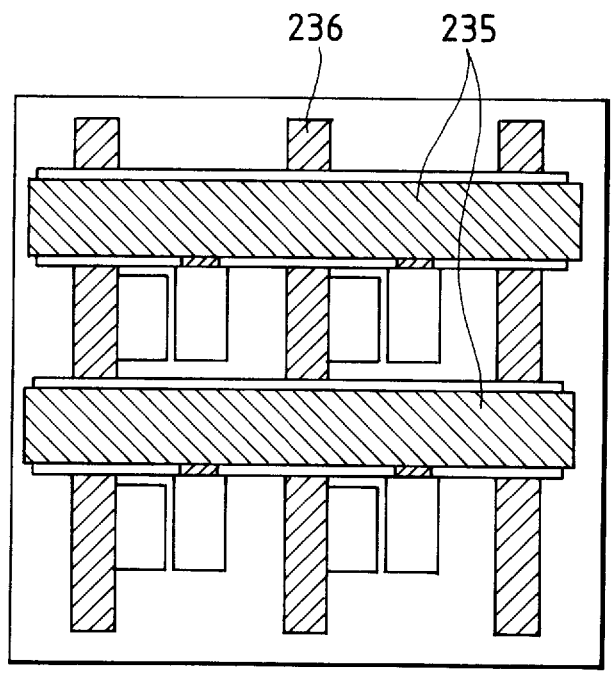
Figure 13E:
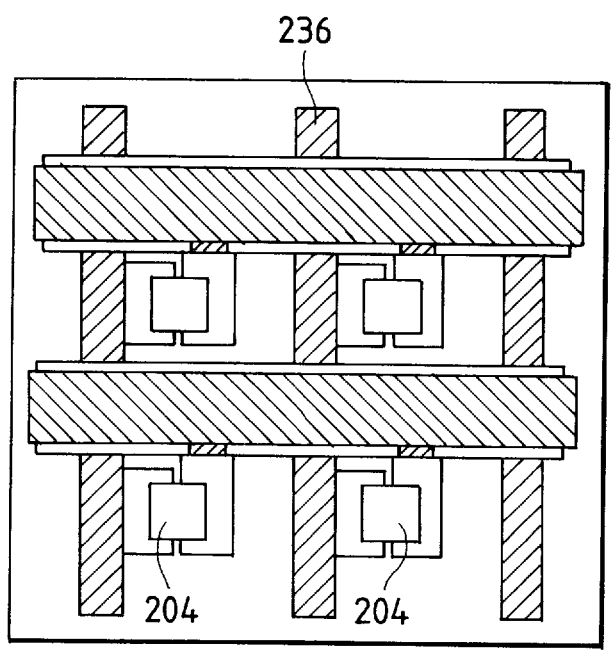

FIGS. 12A and 12B are views which show a typical example of a surface conduction type electron emitting element. In FIGS. 12A and 12B, a reference numeral 201 designates a substrate; 202 and 203, element electrodes for obtaining electrical connections; 204, a conductive thin film; and 205, electron emitting portion. In the surface conduction type electron emitting element, the gap between the aforesaid pair of electrodes 202 and 203 is several hundreds of angstrom to several hundreds of $\mu$m. Also, it is preferable to make the film thickness of the element electrodes 202 and 203 several hundreds of angstrom to several hundreds of $\mu$m. For the conductive thin film 204, it is preferable to adopt a finely granular film formed by fine grains in order to obtain good electron emitting characteristics. The film thickness of the element can be determined by the step coverage to the element electrodes 202 and 203, the resistance value of the element electrodes 202 and 203, and other factors, but, preferably, the film thickness should be several to several thousands of angstrom.

Also, the materials whereby to form the conductive thin film are metals such as Pd, Pt, Au, Ag, Ru, Ti, In, Cu, Cr, Fe, Zn, Sn, Ta, W, Pb, or the like; oxide such as PdO, SnO2, In2O3, PbO, Sb2O3 or the like; boride such as HfB2, ZrB2, LaB6, CeB6, YB4, GdB4, or the like; carbide such as TiC, ZrC, HfC, TaC, SiC, WC or the like; nitride such as TiN, ZrN, HfN or the like; Si, Ge and other semiconductors, and carbon. In this respect, the fine grains described above are meant to be a film for which a plurality of fine grains are gathered, and a film whose structure is such that not only the fine grains are dispersedly arranged individually, but also these grains are adjacent to each other or in a superposed state (including islands). The granular diameter of fine grain is several to several thousands of angstrom, and, preferably, it should be 10 to 200 angstrom.

The electron emitting portion 205 is a high-resistive crack formed partly in the conductive thin film 204. It is formed by energized forming or the like. Also, in the crack, there are included conductive fine grains of several to several thousands of angstrom grain diameter each. Further, the electron emitting portion 205 and the conductive thin film in the vicinity thereof may contain carbon or carbon compound in some cases.

In order to effectuate actual electron emission by use of this surface conduction type electron emitting element, it is necessary to arrange the electron emitting element in a vacuum container. A face plate having fluorescent material, metal back, or the like is arranged to face the electron source having the electron emitting element formed on the substrate thus obtained, and then, a display panel is fabricated with its interior being evacuated. Then, by applying a voltage across the element electrodes, it becomes possible to perform a display. Further, by arranging a plurality of electron emitting elements, it is possible to perform an image display.

[Embodiments]

Embodiment 1

A pattern formation is executed by use of a printer shown in FIG. 1 in accordance with the present invention. A set of linear patterns are arranged to form a screen pattern to be used. The configuration of such linear pattern is such that a set of 100 $\mu$m, 300 $\mu$m, and 500 $\mu$m wide, and 30 cm long are repeated at pitches of 2,000 $\mu$m. The total area of screen pattern is 20 cm×30 cm.

Silver paste of 400,000 cps ink viscosity is used for printing. The squeegee used is a polyurethane flat squeegee having a hardness of 80 degrees. The mesh size and wire diameter used for the screen plate are three kinds of stainless steel screens whose mesh size and stainless steel wire diameter are 230 meshes, 25 $\mu$m, 300 meshes, 20 $\mu$m, and 350 meshes, 16 $\mu$m, respectively. The object element to be printed is soda lime glass. The printing conditions are: gap, 2 mm; press-in amount 2 mm; and squeegee speed, 100 mm/s. After printing, burning is conducted at 600° C. for 10 minutes. Also, suction is performed at a flow rate of 50 l/min at each of the suction ports while the suction ports are set approximately 5 mm away from the screen. The screen separation in this printing is good. When the transferred patterns are observed by use of a photo-microscope, the patterns are transferred in a good precision all over the entire patterning area, showing a good result. As a comparative example, a printing is performed in the same conditions, but in a state that no suction is provided. The result is that the phenomenon of poor screen separation is observed in the central part of the screen pattern. The comparative results will be shown in Table 1.

Embodiment 2

A printer provided with a suction port having an air inlet on its leading end as shown in FIG. 1 and FIG. 2 is used in accordance with the present invention. A pattern formation is carried out as in the Embodiment 1. A sucking condition is set to allow the suction port to be closely in contact with the area in the screen where no pattern is formed. Then the printing is performed with the suction port being closely in contact with such area. This printing shows a better uniformity of the screen separation than that in the Embodiment 1. When the transferred patterns are observed by use of a photo-microscope, the transfer is executed in a good precision in the entire patterning area. A good result is obtained as shown in Table 1.

Embodiment 3

A printer provided with a rigid element as shown in FIG. 3 is used in accordance with the present invention. A pattern formation is carried out as in the Embodiment 1. The rigid element is prepared for use by two each TEFLON® (DuPont)-coated aluminum plates, each having 0.2 mm thick with a curvature r of 0.1 mm being provided for its leading end. The printing is performed in such a manner that the separation member (rigid element) is fixed so that its leading end is in contact with the location 10 mm behind the portion where it abuts upon the screen when the squeegee scans, while the traveling speed of the squeegee and the moving speed of the separation member (rigid element) are set equally. As in the Embodiment 1, this printing shows a good separation. When the transferred patterns are observed by use of a photo-microscope, the transfer is made in a good precision in the entire patterning area. A good result is obtained as shown in Table 1.

Embodiment 4

A printer is used in accordance with the present invention with a magnet being arranged fixedly behind the squeegee as shown in FIG. 5. As in the Embodiment 1, a pattern formation is carried out. A permanent magnet of 800 gauss is employed. In this printing, too, the screen separation is good as in the Embodiment 1. When the transferred patterns are observed by use of a photo-microscope, the transfer is made in a good precision in the entire patterning area. A good result is obtained as shown in Table 1. Also, instead of the permanent magnet, an electromagnet is used. A printing is performed in the same manner as described above while adjusting the magnetic force by means for applying voltage. A good result is obtained as in the case of using the permanent magnet. Since the magnetic force is finely adjustable when the electromagnet is used, it is possible to execute the gap adjustment with ease.

Embodiment 5

A printing is carried out in the same manner as the Embodiment 1 to Embodiment 3 with the exception of nylon meshes used instead of the stainless meshes. It is possible to obtain the same result as in the Embodiments 1 to 3.

Embodiment 6

The printers employed for the Embodiment 1 to Embodiment 5 care used for fabricating an electron source and image formation apparatus by use of each printer, respectively. In conjunction with FIG. 13, this embodiment will be described.

A reference numeral 201 designates a substrate formed by soda lime glass. After a thin metallic film is formed by sputtering, element electrodes 205 and 206 are formed by photoetching. The material is Ni thin film of 100 nm thick with Ti of 5 nm thick used as its under coating layer. In this respect, the gap between element electrodes is 2 $\mu$m, the length of the element electrode 205 is 200 $\mu$m, and that of the element electrode 206 is 300 $\mu$m (see FIG. 13A).

Then, using silver paste a lower wiring (wiring in the line direction) 236 is formed by a printing method in order to make the element electrodes 205 and 206 connectable. These are treated by burning (at a burning temperature of 550° C. for approximately 15 minutes as its peak holding time). The silver paste used here is the same one used for the Embodiments 1 to 5. The width of the wiring is 100 $\mu$m. The thickness thereof is approximately 10 $\mu$m (see FIG. 13B).

Then, an insulating film 250, whose main component is glass, is formed by burning after printing. This is a strip type insulating layer, intersecting the lower wiring (wiring in the line direction) 236. This layer is provided with a cut through which it connects electrically with an upper wiring (wiring in the column direction) and the element electrode 206. The paste material for the insulating film is mainly a PbO paste mixed with glass binder. The burning temperature is 550° C. The peak holding time is 15 minutes. This step of forming the insulating film is repeated twice (see FIG. 13C).

Then, an upper wiring (wiring in the column direction) 235 is formed on the insulating layer 250. The upper wiring is a stripe type pattern formed to be electrically connected with the element electrode 206. the upper wiring is formed in the same way as the lower wiring. Its width is 300 pm, and thickness is 10 $\mu$m (see FIG. 13D).

Subsequently, a conductive thin film (thin film including the electron emitting portion) 204 is formed in such a manner that a thin film is formed by Pd fine grains in a thickness of 20 nm, which is burned after an organic metallic solution (ccp 4230 manufactured by Okuno Pharmaceutical Co.,Ltd.) is coated on it, and then, patterned by the application of photolithography. During these steps of processing, the upper wiring, interlayer insulating layer, and lower wiring are formed by use of the printer adopted in the Embodiments 1 to 5. On the electron source thus fabricated, 100 upper wiring and 100 lower wiring are arranged in matrix through the interlayer insulating layer. This board is provided with 10,000 surface conduction type electron emitting elements.

An image formation apparatus is fabricated by the application of a method similar to the one disclosed in Japanese Patent Laid-Open Application 6-342636 using a face plate having an outer frame, fluorescent element, and others formed on it, and the electron source prepared to assemble them together with the provision of driving circuit therefor. With this apparatus, it is possible to obtain good images.

Embodiment 7

Now, in conjunction with FIG. 8, the description will be made of a contact printing (non snap-off) by use of a printer of the present invention.

A stainless screen of 230 meshes is used. This screen is the same as the one used for the pattern formation in the Embodiment 1. A squeegee is a flat type formed by polyurethane having a hardness of 80 degrees, and sliver paste used is, also, of 400,000 cps.

The printing conditions are: gap is zero mm and the printing portions are closely in contact; press-in amount is 1 mm; and squeegee scanning speed is 100 mm/s. Also, the magnet used is of a flat type, which is a permanent magnet whose magnetic force is 500 gauss. Under these conditions, the scanned area of the screen is attracted by means of a magnetic plate for screen attraction after the squeegee has scanned as discussed earlier with reference to FIG. 8. Then, the stage is slowly lowered at 0.1 mm/s. The screen separation is performed uniformly on the entire surface of an object to be printed. When the patterns thus transferred are observed by use of a photo-microscope, it is ascertained that the transfer is performed in a good precision in the entire patterning area. A good result is obtained. In a case where no magnet is used, the screen separation is slightly poor in the central part of the screen. Also, instead of the permanent magnet, an electromagnet can be used for printing in the same manner. While the electromagnet is being placed close to the screen, such an approach can be executed while turning off the power source for the electromagnet, thus making it easier to complete its close contact.

Embodiment 8

Using a printer shown in FIG. 9 a printing is executed as in the Embodiment 7.

In FIG. 9, a reference numeral 85 designates a supporting member for the magnetic plate supporting head which is a rail for the magnetic plate to move vertically with respect to the plane of the screen. As in the Embodiment 6, the magnet supporting head 72 is allowed to descend along the supporting member 85 by means of a driving mechanism (not shown) after the squeegee has scanned, and then, the magnetic plate 71 is allowed to approach the screen 3 until it is in close contact with it. After the magnetic plate is in close contact, the screen separation is operated as in the Embodiment 7. The pattern transfer executed is as good as with the Embodiment 7.

Embodiment 9

A printing is executed in the same manner as the Embodiment 7 with the exception of a printer used, which is shown in FIG. 10.

In FIG. 10, a reference numeral 14 designates a hinge type supporting member for magnetic plate supporting head, which enables the magnetic plate 71 to be in parallel with the plane of the screen when the magnetic plate is allowed to rotate around the shaft parallel to the plane of the screen. After the magnetic plate 71 is in close contact with the screen 3, the screen separation is operated as in the Embodiment 7. The patterns transferred are as good as in the Embodiment 7.

Embodiment 10

A printing is executed as in the Embodiment 7 with the exception of a printer used, which is shown in FIG. 11.

In FIG. 11, a reference numeral 85 designates a supporting member for magnetic plate supporting head which is a shaft planted vertically with respect to the plane of the screen. The magnetic plate 71 is allowed to rotate around this shaft in a plane which is parallel to the plane of the screen, thus moving the plate above the screen to be in a state parallel to the screen surface. After the magnetic plate 71 is closely in contact with the screen 3, the screen separation is operated as in the Embodiment 7. The patterns transferred are as good as in the Embodiment 7.

Embodiment 11

Using printers shown in the Embodiments 7 to 10 electron source and image formation apparatuses are fabricated as in the Embodiment 6. It is possible to provide both electron source and image forming apparatuses as good as those fabricated in the Embodiment 6.

TABLE 1

|  | 230 mesh | 300 mesh | 350 mesh |
|---|---|---|---|
| Embodiment 1 | ○ | ○–◉ | ◉ |
| Embodiment 2 | ○ | ○–◉ | ◉ |
| Embodiment 3 | ○ | ○–◉ | ◉ |
| Comparative Example | △ | △ | △ |

◉: Excellent
○: Good
△: Fair

What is claimed is:

1. A screen printer with a printing table for setting an object to be printed, a screen, and a squeegee, said squeegee being arranged through said screen on said object to be printed set on said printing table, depending on screen patterns set on said screen, ink patterns being formed on said object to be printed by allowing said squeegee to move in contact with ink, said printer comprising:

a shaft provided on said printing table substantially perpendicular to a surface of said screen: and applying means rotatably supported by said shaft around an axis substantially perpendicular to the surface of said screen and movable with respect to said screen, said applying means applying an external force in a direction to offset an adhesive strength of ink between said screen and said object to be printed.

2. A screen printing method in which a squeegee is arranged through a screen on an object to be printed, and in which, depending on screen patterns set on said screen, ink patterns are formed on said object to be printed by allowing said squeegee to travel in contact with ink, said method comprising the following steps of:

forming said ink patterns by allowing said squeegee to travel;

moving application means, for applying an external force, into position proximal to said screen by rotating said application means around an axis substantially perpendicular to a plane of said screen; and applying an external force for separating said screen from said object to be printed by said application means.

3. A screen printer provided with a printing table for setting an object to be printed, a screen, and a squeegee, said squeegee being arrangeable through said screen on said object to be printed set on said printing table, and depending on screen patterns set on said screen, ink patterns being formed on said object to be printed by allowing said squeegee to move in contact with ink, said printer comprising:

applying means, movably arranged with respect to said screen, for applying an external force in a direction to offset an adhesive strength of ink between said screen and said object to be printed, said applying means being provided with means for providing suction and a suction port connected to said means for providing suction, said suction port being arranged to apply the suction at an area of said screen on which the screen patterns are not set.

4. A screen printer according to claim 3, wherein grooves are provided on a leading end of said suction port.

5. A screen printing method in which a squeegee is arranged through a screen on an object to be printed, and in which, depending on screen patterns set on said screen, ink patterns are formed on said object to be printed by allowing said squeegee to travel in contact with ink, said method comprising the following steps of:

forming said ink patterns by allowing said squeegee to travel; and applying suction, for separating said screen from said object to be printed, in a position shiftable with respect to an area of said screen on which the screen patterns are not set.

6. A screen printing method according to claim 5, wherein said step of forming ink patterns and said step of applying suction are performed simultaneously.

7. A screen printing method according to claim 5, wherein said step of forming ink patterns is performed before the execution of said step of applying suction.

8. A screen printing method according to claim 7, wherein said step of applying suction in the position shiftable is accomplished by use of suction means for providing suction, said suction means being interlocked with said squeegee.

9. A screen printing method according to claim 5, wherein said step of forming ink patterns includes forming a circuit pattern.

10. A screen printing method according to claim 9, wherein said step of forming a circuit pattern includes forming wiring.

11. A screen printing method according to claim 9, wherein said method is applied to manufacture an electron source.

12. A screen printing method according to claim 9, wherein said method is applied during the manufacture of an image forming apparatus.

13. A screen printer provided with a printing table for setting an object to be printed, a screen, and a squeegee, said squeegee being arrangeable through said screen on said object to be printed set on said printing table, and depending on screen patterns set on said screen, ink patterns being formed on said object to be printed by allowing said squeegee to move in contact with ink, said printer comprising:

applying means movably arranged with respect to said screen, for applying an external force in a direction to offset an adhesive strength of ink between said screen and said object to be printed, said applying means being a magnet, and said screen being formed by a magnetically attractable material.

14. A screen printer according to claim 13, wherein an area of said magnet is greater than a scanning area of the squeegee.

15. A screen printer according to claim 13, wherein said magnet is an electromagnet.

16. A screen printer according to claim 13, further comprising a head provided with said magnet and a squeegee, said head being scanned on the screen.

17. A screen printer according to claim 13, wherein said printer includes a contact screen printer for printing by closely contacting the screen with said object to be printed.

18. A screen printer according to claim 17, further comprising support means for supporting said magnet so that said magnet is rotatable around a shaft substantially parallel to said screen and movable to a position closely contacting said screen.

19. A screen printer according to claim 17, further comprising a shaft provided on said printing table substantially perpendicular to said screen and support means for supporting said magnet so that said magnet is movable in a direction substantially perpendicular to said screen along said shaft and movable to a position closely contacting said screen.

20. A screen printer according to claim 17, further comprising a shaft provided on said printing table substantially perpendicular to said screen, said shaft rotatably supporting said magnet around said shaft.

21. A screen printer according to claim 17, wherein a mesh size of said screen is not less than 300 meshes and a diameter of a wire used for the mesh is not more than 20 $\mu$m.

22. A screen printer according to claim 21, wherein a mesh size of said screen is not less than 350 meshes and a diameter of a wire used for the mesh is not more than 16 $\mu$m.

23. A screen printing method in which a squeegee is arranged through a magnetically attractable screen on an object to be printed, and in which, depending on screen patterns set on said screen, ink patterns are formed on said object to be printed by allowing said squeegee to travel in contact with ink, said method comprising the following steps of:

forming said ink patterns by allowing said squeegee to travel; and applying a magnetic force, for separating said screen from said object to be printed, in a position shiftable with respect to said screen.

24. A screen printing method according to claim 23, wherein said step of forming ink patterns is performed before execution of said step of applying the magnetic force.

25. A screen printing method according to claim 23, wherein said formation of said ink patterns is performed by closely contacting said object to be printed with said screen.

26. A screen printing method according to claim 25, wherein said application of the magnetic force is performed, after forming the ink pattern, by rotating a magnet from a location remote from said screen and around a shaft substantially parallel to said screen and moving the magnet to a position in close contact with said screen.

27. A screen printing method according to claim 25, wherein said application of the magnetic force is performed, after forming the ink pattern, by moving a magnet from a location remote from said screen and along a shaft substantially perpendicular to said screen and to a position in close contact with said screen.

28. A screen printing method according to claim 25, wherein said application of the magnetic force is performed, after forming the ink pattern, by rotating a magnet from a location remote from said screen and around a shaft substantially perpendicular to said screen and moving the magnet to a position in close contact with said screen.

29. A screen printing method in which a squeegee is arranged through a screen on an object to be printed set on a printing table, and in which, depending on screen patterns set on the screen, ink patterns are formed on the object to be printed by allowing the squeegee to move in contact with ink, said printing method comprising the steps of:

forming the ink patterns by allowing the squeegee to travel;

applying, using applying means, an external force in a direction to offset an adhesive strength of ink between the screen and the object to be printed; and providing the applying means on both sides of a scan area by the squeegee and providing the applying means with a plurality of rigid members to be inserted between the screen and the object to be printed.

30. A screen printing method according to claim 23 or 29, wherein said step of forming ink patterns and said applying step are performed simultaneously.

31. A screen printing method according to claim 23 or 29, wherein said step of forming ink patterns includes forming a circuit pattern.

32. A screen printing method according to claim 31, wherein said step of forming a circuit pattern comprises forming wiring.

33. A screen printing method according to claim 32, wherein said method is applied to manufacture an electron source.

34. A screen printing method according to claim 33, wherein said method is applied during the manufacture of an image forming apparatus.

35. A screen printer with a printing table for setting an object to be printed, a screen, and a squeegee, said squeegee being arranged through said screen on said object to be printed set on said printing table, depending on screen patterns set on said screen, ink patterns being formed on said object to be printed by allowing said squeegee to move in contact with ink, said printer comprising:

applying means for applying an external force in a direction to offset an adhesive strength of ink between said screen and said object to be printed, wherein said applying means is provided on both sides of a scan area by said squeegee and comprises a plurality of rigid members to be inserted between said screen and said object to be printed.

36. A screen printer according to claim 35, wherein a mesh size of said screen is not less than 300 meshes and a diameter of a wire used for the mesh is not more than 20 $\mu$m.

37. A screen-printer according to claim 36, wherein a mesh size of said screen is not less than 350 meshes and a diameter of a wire used for the mesh is not more than 16 $\mu$m.

* * * * *

UNITED STATES PATENT AND TRADEMARK OFFICE
CERTIFICATE OF CORRECTION

PATENT NO. : 5,839,363
DATED : November 24, 1998
INVENTOR(S) : Yoshihiro Yanagisawa, et al.

It is certified that error appears in the above-identified patent and that said Letters Patent is hereby corrected as shown below:

Drawing Sheet 2:
Figure 4, please delete reference numberal "44" and the accompanying lead line, as shown on the attached drawing sheet.

Figure 14:
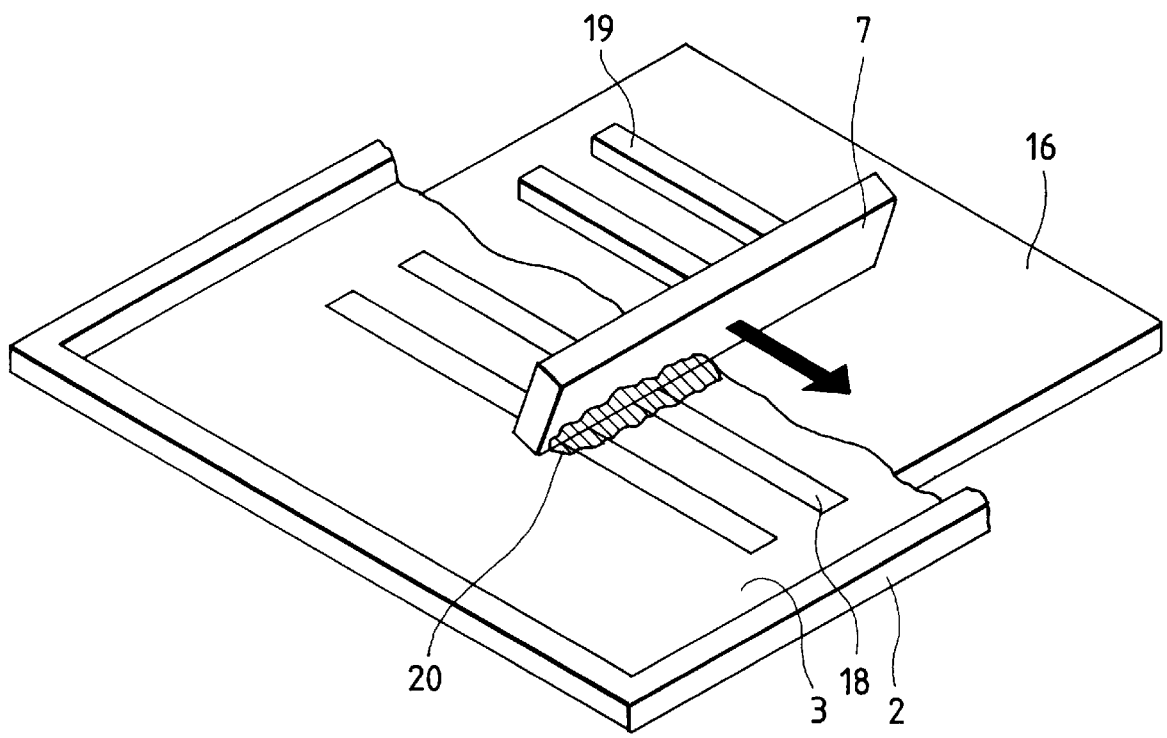
FIG. 14 is a perspective view which schematically shows the squeegee scanning of a conventional screen printer.
Figure 15:
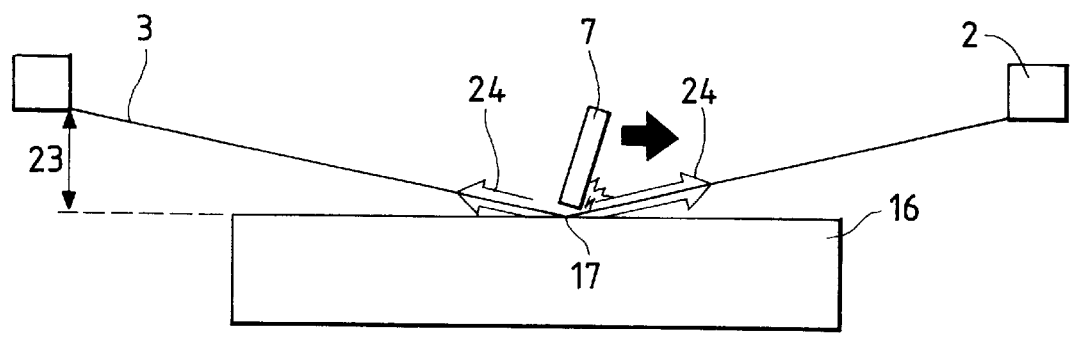
FIG. 15 is a cross-sectional view which schematically shows a conventional screen printer.

Drawing Sheet 10:
Figures 14 and 15, please label the figures --PRIOR ART--, as shown on the attached drawing sheet.

Figure 16:
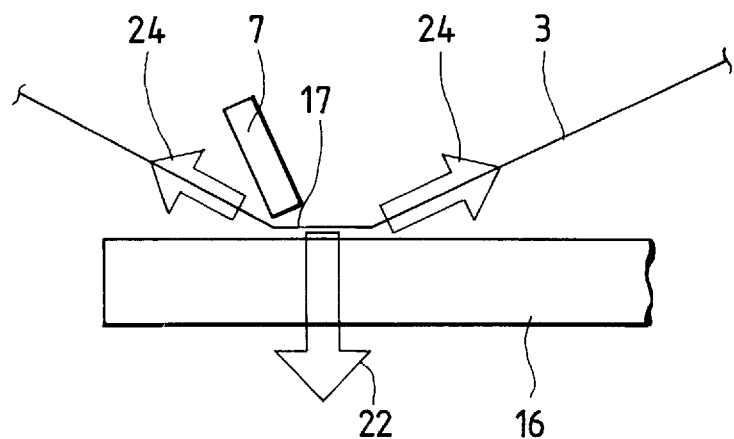
FIG. 16 is a cross-sectional view which schematically shows the portion pressed by a squeegee when it scans in a conventional screen printer.
Figure 17:
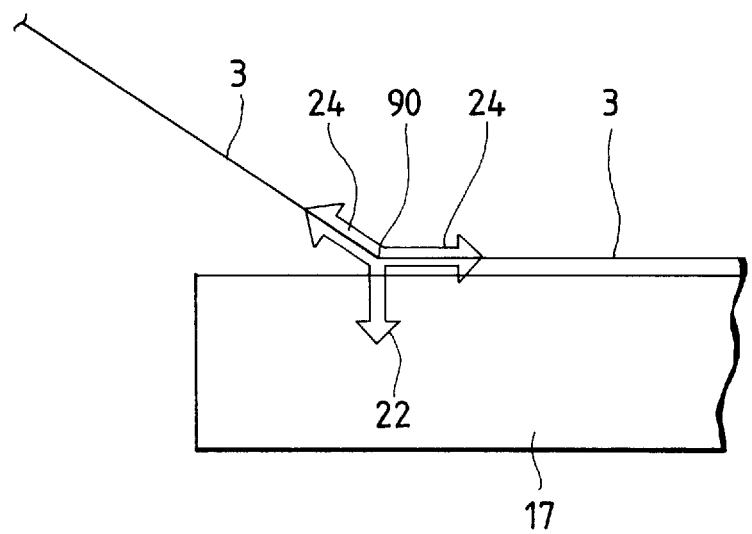
FIG. 17 is a view which schematically shows the principle of conventional screen printing.
Figure 3:
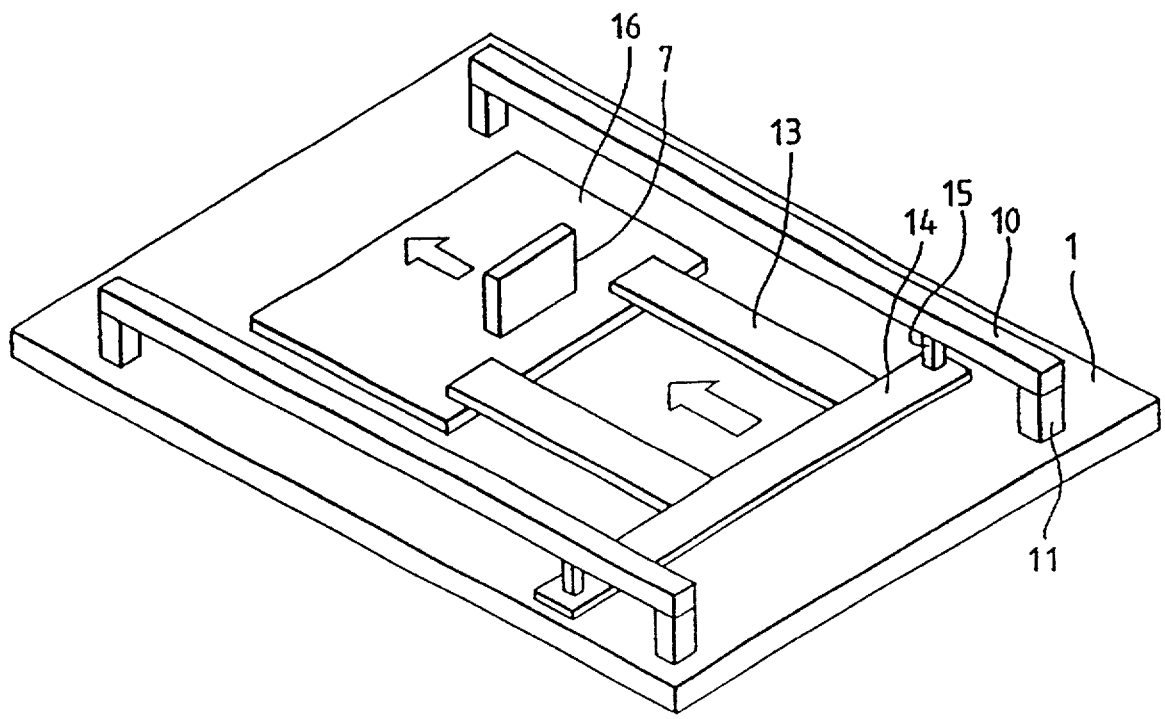
Figure 4:
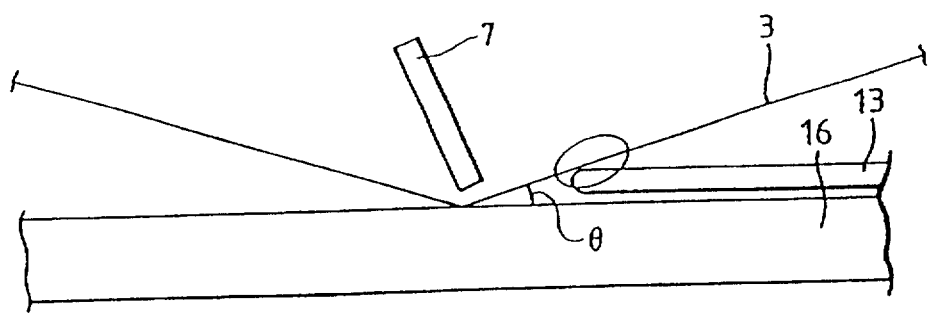
Figure 14:
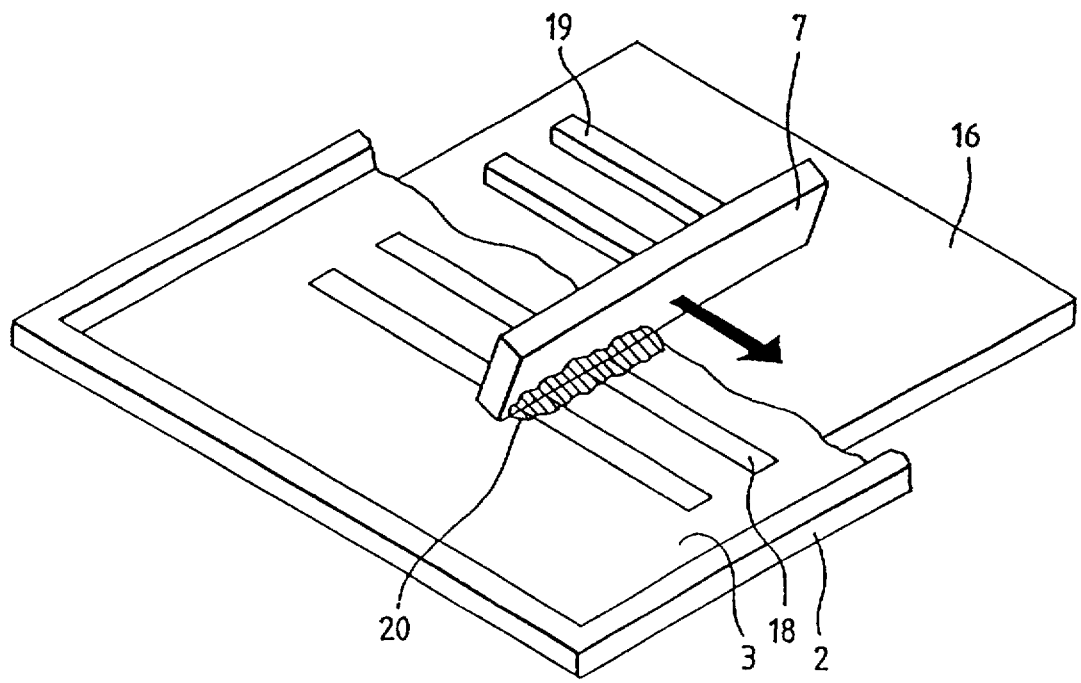
Figure 15:
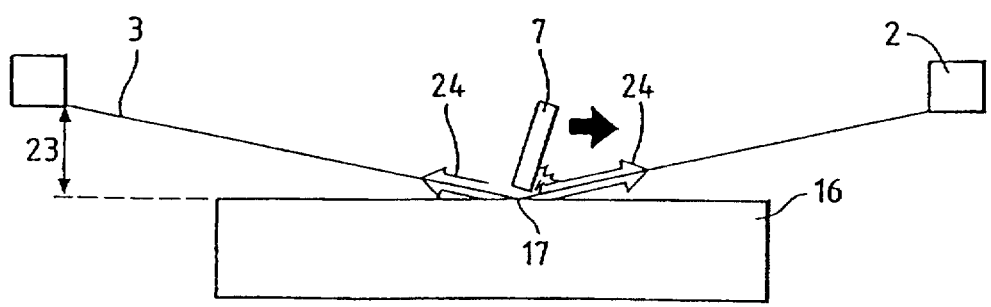
Figure 16:
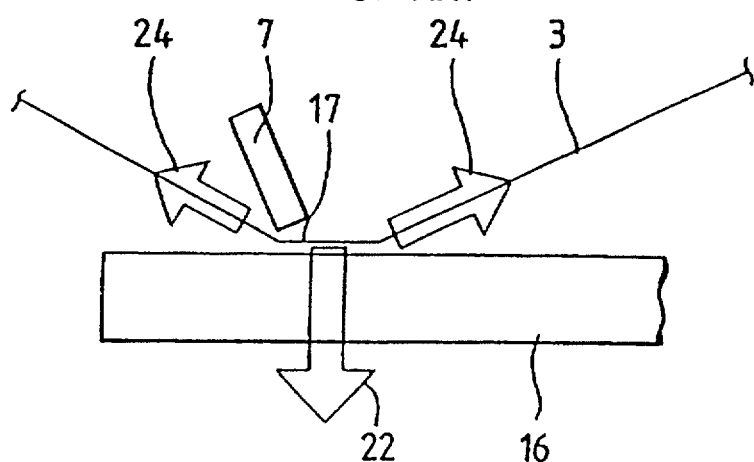
Figure 17:
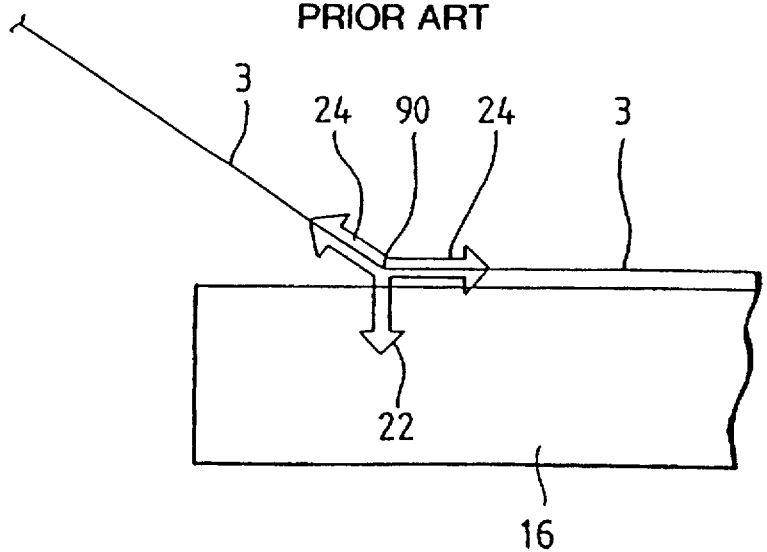

Drawing sheet 11:
Figures 16 and 17, please label the figures --PRIOR ART--, as shown on the attached drawing sheet.

Column 1:
Line 22, "20 ink; 24" should read --20, ink; 24,--

Column 2:
Line 4, "printed it (that is, with its gap=0), hence" should read --printed).--;
Line 5, "reguiring the squeegee to travel for printing in such a state." should be deleted;
Line 38, "objected." should read --object.--.

Column 3:
Line 62, "FIGS. 6A" should read --¶FIGS. 6A--.

Column 4:
Line 18, "shows" should read --show--.

Column 5:
Line 9, "FIGS. 1," should read --FIGS. 1--.

Column 7:
Line 7, "6B" should read --6B,--.

UNITED STATES PATENT AND TRADEMARK OFFICE
CERTIFICATE OF CORRECTION

PATENT NO. : 5,839,363
DATED : November 24, 1998
INVENTOR(S) : Yoshihiro Yanagisawa, et al.

It is certified that error appears in the above-identified patent and that said Letters Patent is hereby corrected as shown below:

Column 8:
Line 8, "adsorbs" should read --attracts--;
Line 13, "adsorb" should read --attract--.

Column 11:
Line 10, "each" should be deleted.

Column 12:
Line 14, "the" (second occurrence) should read --The--.
Line 15, "300pm," should read --300µm,--;
Line 54, "scanned" should read --scanned,--.

Column 14:
Line 2, "screen:" should read --screen;--.

Column 15:
Line 14, "means" should read --means,--.

Column 16:
Line 63, "screen-printer" should read --screen printer--.

Signed and Sealed this

Twenty first Day of August, 2001

*Nicholas P. Godici*

*Attest:*

NICHOLAS P. GODICI
*Attesting Officer*     *Acting Director of the United States Patent and Trademark Office*